(12) United States Patent
Bartley et al.

(10) Patent No.: US 8,796,578 B2
(45) Date of Patent: Aug. 5, 2014

(54) IMPLEMENTING SELECTIVE REWORK FOR CHIP STACKS AND SILICON CARRIER ASSEMBLIES

(71) Applicant: International Business Machines Corporation, Armonk, NY (US)

(72) Inventors: Gerald K. Bartley, Rochester, MN (US); Darryl J. Becker, Rochester, MN (US); Philip R. Germann, Oronoco, MN (US); Andrew B. Maki, Issaquah, WA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/869,658

(22) Filed: Apr. 24, 2013

(65) Prior Publication Data
US 2013/0233832 A1 Sep. 12, 2013

Related U.S. Application Data

(62) Division of application No. 12/833,252, filed on Jul. 9, 2010, now Pat. No. 8,519,304.

(51) Int. Cl.
*B23K 1/018* (2006.01)
*B23K 3/047* (2006.01)

(52) U.S. Cl.
CPC ............... *B23K 1/018* (2013.01); *B23K 3/0478* (2013.01)
USPC ............. 219/50; 219/162; 219/209; 219/543; 257/686; 257/777; 438/109

(58) Field of Classification Search
USPC ............. 219/50, 209, 162, 543; 257/686, 777
See application file for complete search history.

(56) References Cited

U.S. PATENT DOCUMENTS

| | | | |
|---|---|---|---|
| 6,031,729 A | 2/2000 | Berkely et al. | |
| 6,114,674 A | 9/2000 | Baugh et al. | |
| 6,195,268 B1 | 2/2001 | Eide | |
| 6,423,939 B1 | 7/2002 | Pan | |
| 6,540,525 B1 | 4/2003 | Li et al. | |
| 7,474,540 B1 * | 1/2009 | Dang et al. | 361/803 |
| 2004/0035840 A1 | 2/2004 | Koopmans | |
| 2007/0176297 A1 | 8/2007 | Zohni | |

* cited by examiner

*Primary Examiner* — Thinh T Nguyen
(74) *Attorney, Agent, or Firm* — Joan Pennington (57) ABSTRACT

A method, apparatus, and structure are provided for implementing selective rework for chip stacks. A backside metal layer to create resistive heating is added to a chip backside in a chip stack. A rework tool applies a predefined current to the backside metal layer to reflow solder connections and enables separating selected chips in the chip stack.

4 Claims, 8 Drawing Sheets

IMPLEMENTING SELECTIVE REWORK FOR CHIP STACKS AND SILICON CARRIER ASSEMBLIES

This application is a divisional of application Ser. No. 12/833,252 filed Jul. 9, 2010.

FIELD OF THE INVENTION

The present invention relates generally to the field of semiconductor devices and electronic design, and more particularly, relates to a method, apparatus, and structure for implementing selective rework for chip stacks.

DESCRIPTION OF THE RELATED ART

As used in the following description and claims, the term chip stack should be understood to broadly include a chip carrier, a silicon-based carrier, a silicon carrier assembly, and multiple chips assembled and interconnected together in a stack.

Recent advances in through-silicon via technology have given new life to chip stacking, alternative chip carrier and silicon-based carriers. Stacking minimizes path latencies, can lead to improved architectural benefits, and potential cost advantages.

A disadvantage associated with stacking is the difficulties in reworking the stack to preserve a known good die and dispose of a known bad die. Testing can be performed on the die individually before stacking assembly, or together as a stack. Each method has significant disadvantages. By serially testing the die, test time is added, with the further disadvantage of being unable to fully test the off-chip interfaces. By testing the stack, a die, which is found bad, cannot be easily removed from the stack, and the stack then reassembled.

A feasible and efficient method for reworking chip stacks does not yet exist, and the market for these technologies is continuing to grow. A need exists for effective and efficient structure and rework methods for chip stacking and silicon carrier assemblies.

SUMMARY OF THE INVENTION

A principal aspect of the present invention is to provide a method, apparatus, and structure for implementing selective rework for chip stacks. Other important aspects of the present invention are to provide such method, apparatus, and structure substantially without negative effect and that overcome many of the disadvantages of prior art arrangements.

In brief, a method, apparatus, and structure are provided for implementing selective rework for chip stacks. A backside metal layer to create resistive heating is added to a chip backside in a chip stack. The rework tool applies a predefined current to the backside metal layer to reflow solder connections and enables separating selected chips in the chip stack.

In accordance with features of the invention, by sending the predefined current through the metal layer on the backside of the chip at a desired level within a stack, a local temperature increase is created to reflow the solder connections, such as (micro controlled collapsed chip connection) μ-C4 solder balls of the chip backside. By pre-heating the entire chip stack to a certain amount of degree below the reflow temperature of solder, the local temperature increase at the desired location within the stack is enough to reflow the solder and allow for easy separation of the stack.

In accordance with features of the invention, the backside metal layer includes a grid, or a series of traces connected to the landing pad. The backside metal layer includes a respective landing pad proximate to opposed edges of the chip for engagement with the rework tool. The rework tool applies the set current through the landing pads. The rework tool is shaped to facilitate use of the tool to force the chip stack apart. The rework tool has a wedge shape.

In accordance with features of the invention, a rework tool controller receives sensor inputs and controls the rework tool for applying the predefined current to the backside metal layer to reflow solder connections and enable separating the chip stack.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, apparatus, and structure are provided for implementing selective rework for chip stacks. A feasible and efficient method for reworking chip stacks is provided using an added metal layer on a chip in a chip stack to create resistive heating.

Figure 1:
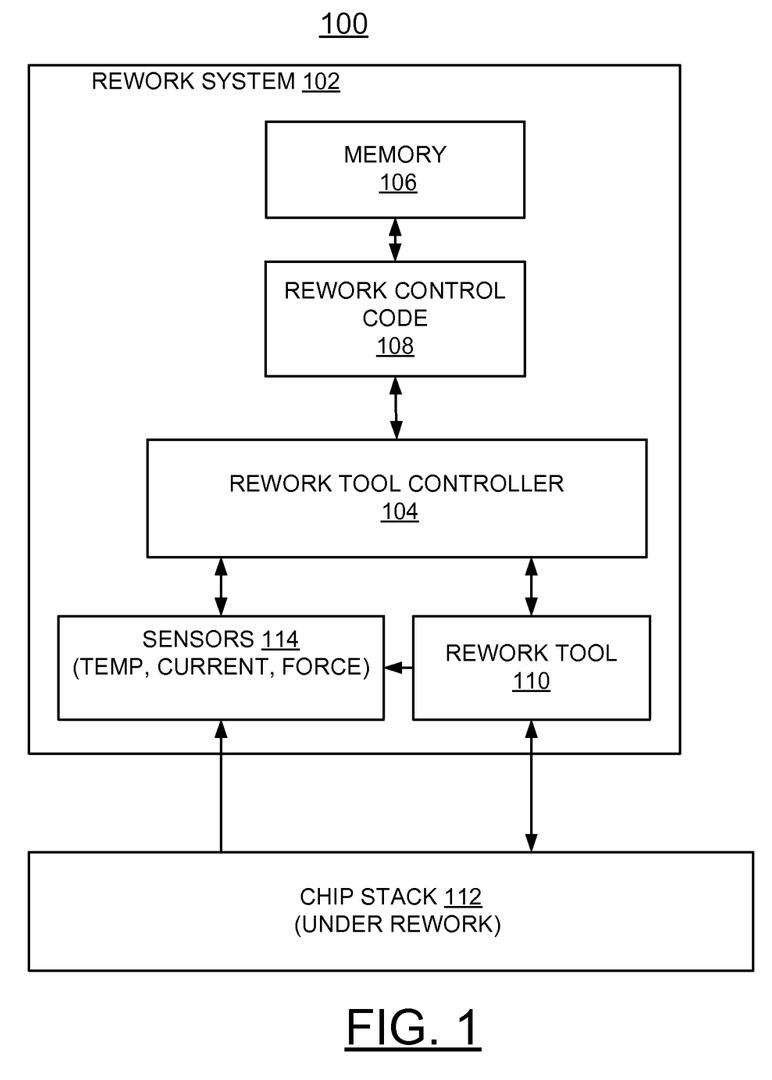
FIG. 1 is a block diagram representation illustrating a system for implementing selective rework for chip stacks in accordance with the preferred embodiment.

Having reference now to the drawings, in FIG. 1, there is shown an example system for implementing selective rework for chip stacks generally designated by the reference character 100 in accordance with the preferred embodiment. System 100 includes a rework computer system 102 including a rework tool controller 104 coupled to a memory 106, and rework control code 108 of the preferred embodiment. The rework computer system 102 includes a rework tool 110 coupled to a chip stack 112 under rework. The rework computer system 102 includes a plurality of sensors 114 coupled to the rework tool 110, and chip stack 112, for example, sensing temperature, current and force, and coupled to the rework tool controller 104.

System 100 is shown in simplified form sufficient for understanding the present invention. The illustrated system 100 is not intended to imply architectural or functional limitations. The present invention can be used with various hardware implementations and systems and various other internal hardware devices. The rework tool controller 104 is suitably programmed by the rework control code 108 to execute the flowchart of FIG. 3 for implementing selective rework within chip stacks in accordance with the preferred embodiment.

Figure 2:
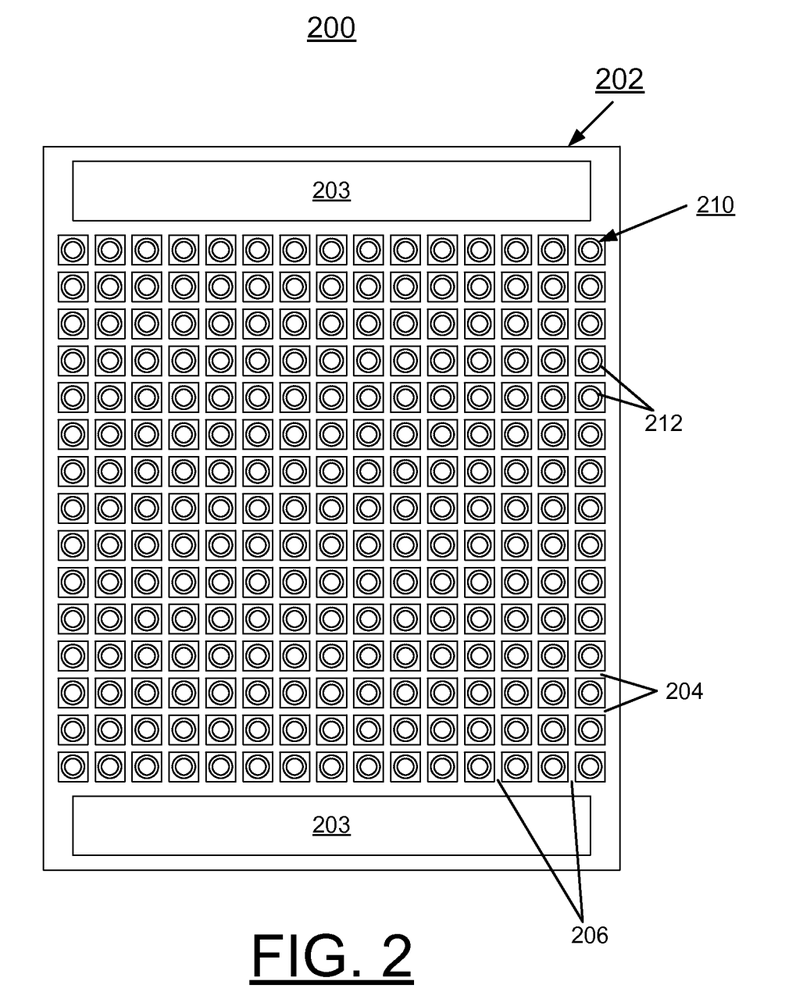
FIG. 2 illustrates an example backside metal structure on a chip used for implementing selective rework for chip stacks in accordance with the preferred embodiment.

Referring to FIG. 2, there is shown an example metal structure generally designated by the reference character 200 on a chip with a backside metal structure generally designated by the reference character 202 used for implementing selective rework for chip stacks in accordance with the preferred embodiment. The metal layer or backside metal structure 202 is added to a chip backside to create resistive heating in a chip stack. The backside metal layer 202 includes a pair of landing pads 203 located proximate to respective opposed edges of the chip for engagement with the rework tool 110. The backside metal layer 202 includes a plurality of uniformly spaced apart horizontal traces 204 and a plurality of uniformly spaced apart vertical traces 206, each trace electrically connected to the landing pads 203.

An array 210 of solder pads 212 preferably is not connected to the added backside metal layer 202, as shown. The backside metal layer 202 including the landing pads 203, the horizontal mesh traces 204 and the vertical mesh traces 206 is formed of a selected metal or other resistive material. For example, the backside metal layer 202 is formed of tungsten, copper, or a nichrome (NiCr), which is a non-magnetic alloy of nickel and chromium.

The chip stack 112 includes, for example, silicon chips having a 10 mm×10 mm die with an array 210 of solder bumps 212, such as, micro controlled collapsed chip connection) μ-C4 solder balls attached to respective silicon chips and using μ-C4s, for example, 20 μm diameter×10 μm height×50 μm pitch) with a 10 μm antipad and 10 μm metal between pads. A required current for a set time interval to increase the required temperature of the backside metal layers 202 in the chip stack 112 is provided based upon the chip backside area, the configuration of and the material forming the backside metal layer 202, and the location and number of solder bumps 212 across the chip backside.

In accordance with features of the invention, by using only the single layer backside metal layer 202 to implement the heating element for chip separation, the only required process addition is a single metal deposition step or metallization of the backside of the chip defining the backside metal layer 202, without requiring multiple layers or etch processes. The metallized structures 202 are formed on each selected chip prior to the assembly of the chip stack, enabling the method of the invention for selectively separating any layer in chip stack or silicon carrier assembly 112.

Figure 3:
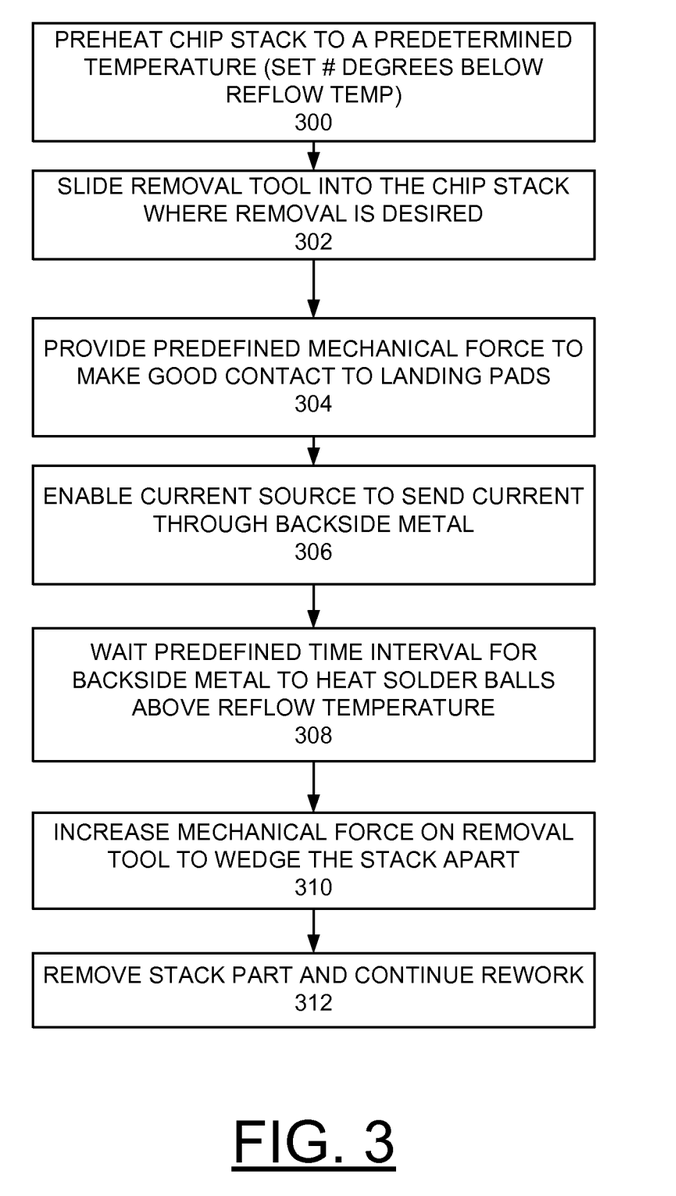
FIG. 3 is a flow chart illustrating example operations for implementing selective rework for chip stacks in accordance with the preferred embodiment.

Referring to FIG. 3 and to FIGS. 4A, 4B, 4C, 4D, and 4E, example operations are shown for implementing selective rework for chip stacks in accordance with the preferred embodiment. As indicated at a block 300, a chip stack 112 to be reworked is preheated to a predetermined temperature, which is a set number of degrees below the reflow temperature. The rework or removal tool 110 is inserted into the chip stack 112 where removal is desired as indicated at a block 302.

Figure 4A:
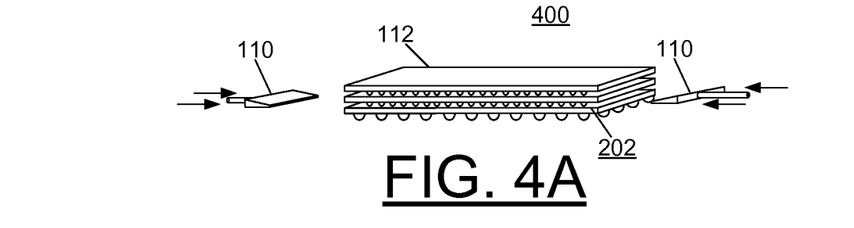
FIGS. 4A, 4B, 4C, 4D, and 4E illustrate example operations for implementing selective rework for chip stacks in accordance with the preferred embodiment.

Referring now to FIG. 4A, an example operation generally designated by the reference character 400 is shown for selective rework for chip stacks in accordance with the preferred embodiment. Operation 400 illustrates a pair of removal tools 110 aligned with a selected backside metal layer 202 in the chip stack 112.

Figure 4B:
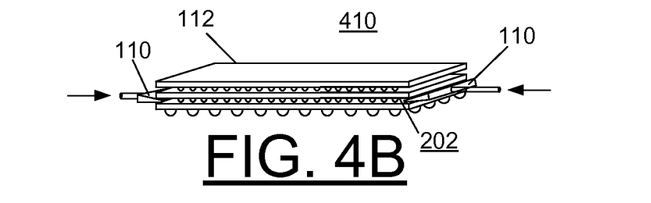

Referring also to FIG. 4B, a next example operation generally designated by the reference character 410 is shown for selective rework for chip stacks in accordance with the preferred embodiment. Operation 410 illustrates the removal tools 110 inserted into the chip stack 112 where removal is desired engaging the selected backside metal layer 202 in the chip stack 112.

As indicated at a block 304, a predefined mechanical force on the removal tool 110 is provided to make good contact with the landing pad 203 of the selected backside metal layer 202 in the chip stack 112.

Figure 4C:
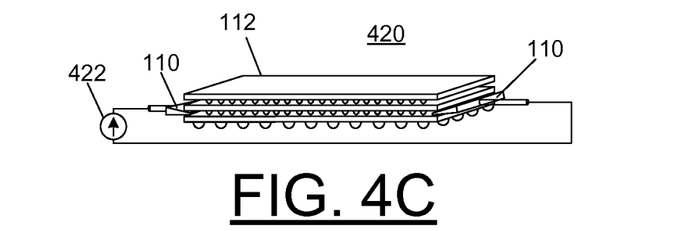

Referring also to FIG. 4C, a next example operation generally designated by the reference character 420 is shown for selective rework for chip stacks in accordance with the preferred embodiment. Operation 420 illustrates a current source 422 connected to the removal tools 110 to heat the selected backside metal layer 202 in the chip stack 112.

As indicated at a block 306, the current source is enabled to send current through the backside metal 202. A predefined wait time period is provided for the selected backside metal layer 202 in the chip stack 112 to heat the adjacent solder balls above the reflow temperature as indicated at a block 308. As indicated at a block 310, mechanical force on each removal tool 110 is increased to wedge the stack apart.

Figure 4D:
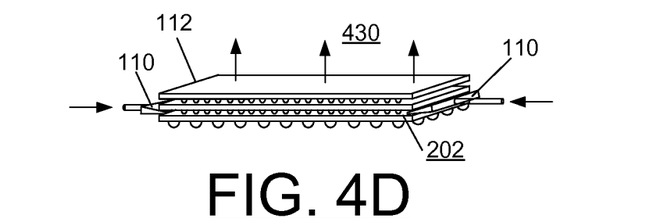

Referring also to FIG. 4D, a next example operation generally designated by the reference character 430 is shown for selective rework for chip stacks in accordance with the preferred embodiment. Operation 430 illustrates using the removal tool 110 to mechanically assist in the separation of the chips in the chip stack 112 with mechanical force on the removal tool 110 being increased to wedge the stack apart.

Figure 4E:
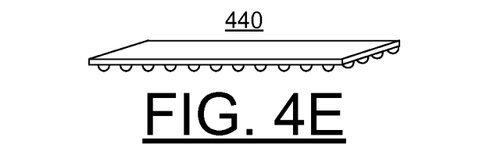

As indicated at a block 312, the part of the chip stack 112 is removed and rework continues. Referring also to FIG. 4E, a next example operation generally designated by the reference character 430 is shown with the part of the chip stack 112 is removed so that rework can be continued.

Figure 5:
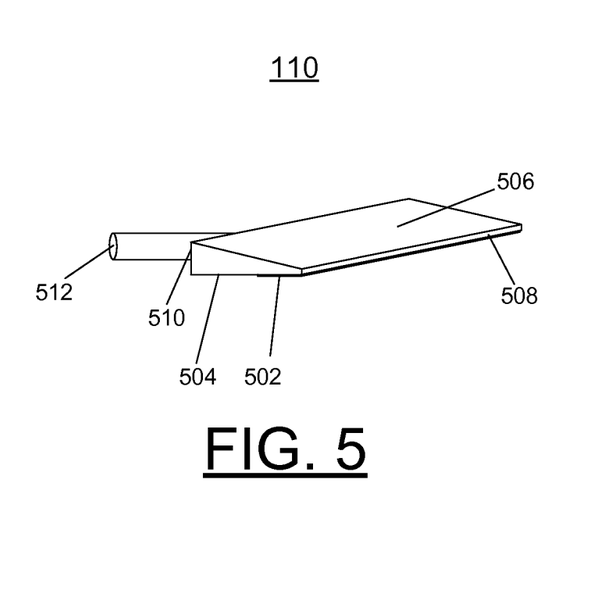
FIG. 5 illustrates an example rework tool used for implementing selective rework for chip stacks in accordance with the preferred embodiment.

Referring now to FIG. 5 there is shown an example rework tool 110 used for implementing selective rework for chip stacks in accordance with the preferred embodiment. The rework tool 110 includes an electrically conductive portion 502 on a lower generally flat tool side 504 providing an electrical connection to the landing pad 203 of the selected backside metal layer 202 in the chip stack 112 under rework. The opposed upper side 506 has a sloped profile from a front mating face 508 to an opposed end 510 of the rework tool, providing a wedge shape that is effectively and efficiently used to separate the chip from the chip stack 112 at the correct time in the selective rework process. The rework tool 110 includes a physical driver and electrical connection member 512 coupled to the rework tool controller 104. The rework tool controller 104 provides the desired electrical current and mechanical force to the rework tool 100 via the physical driver and electrical connection member 512 to separate the chip stack 112 at a selected chip backside metal structure 202.

The rework tool 110 is formed of selected materials having sufficient strength to apply the required forces during the selective rework process and including an electrically conductive connection within member 512 to the electrically conductive portion 502 capable of inducing the required current or heat through the landing pads 203.

Figure 6A:
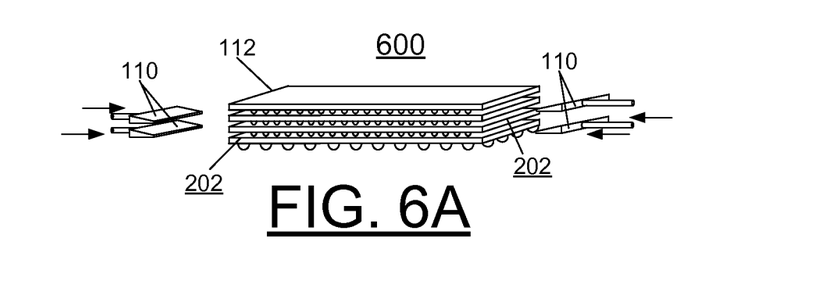
FIGS. 6A, 6B, and 6C illustrate example operations for implementing selective rework for chip stacks in accordance with another embodiment.
Figure 6B:
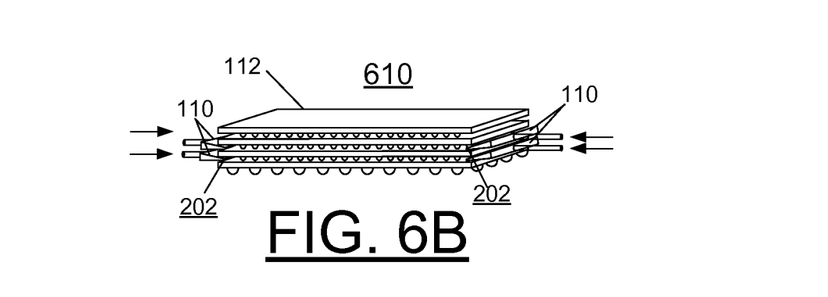
Figure 6C:
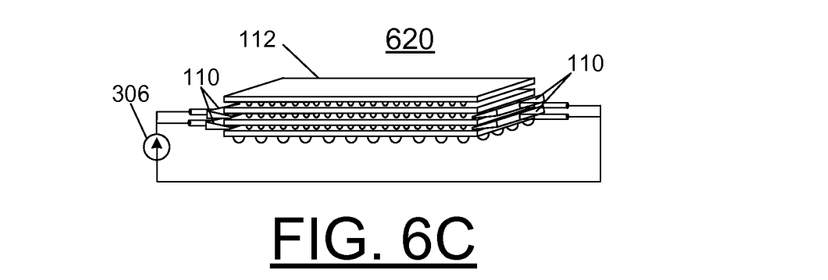

Referring to FIGS. 6A, 6B, and 6C, there are shown example operations for implementing selective rework for chip stacks in accordance with another preferred embodiment. As shown, a pair of removal tools 110 are providing on each side of the chip stack 112 that are used to simultaneously separate two interface layers of the chip stack. Alternatively, a single double-edged tool could be used to simultaneously separate two interface layers.

In FIG. 6A, an operation 600 illustrates two pairs of removal tools 110 aligned with a selected pair of backside metal layers 202 in the chip stack 112. In FIG. 6B, an operation 610 illustrates the two pair of removal tools 110 inserted within the chip stack 112 at the selected backside metal layers 202. In FIG. 6C, an operation 620 illustrates the current source 306 connected to the two pair of removal tools 110 enabling the removal of a selected chip die from within the chip stack 112 with a single reflow and separation process.

Figure 7:
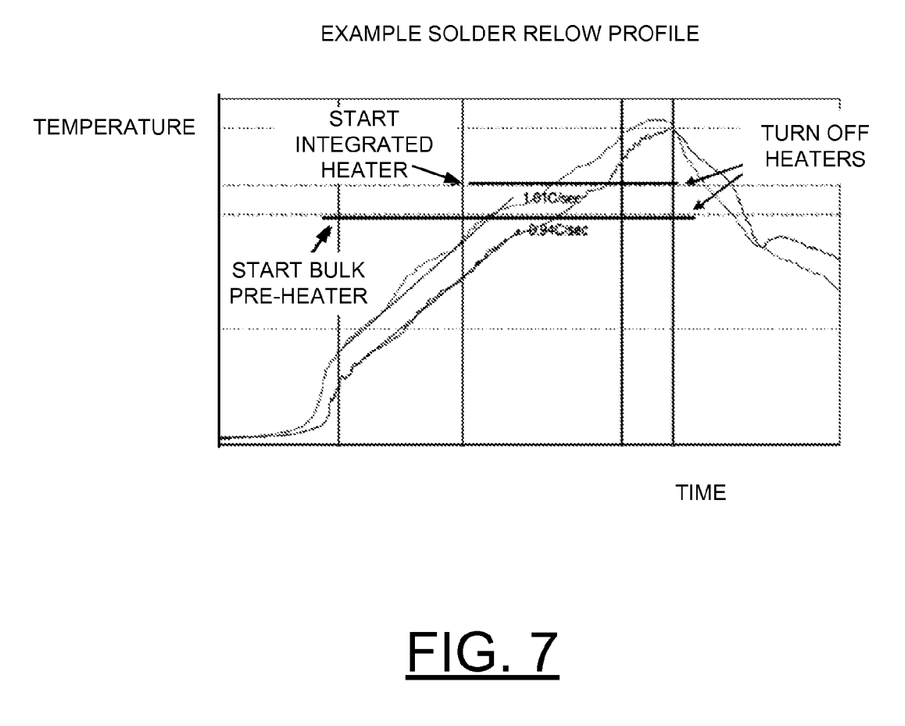
FIG. 7 illustrates an example solder reflow profile used for implementing selective rework for chip stacks in accordance with the preferred embodiment.

Referring also to FIG. 7, there is shown an example solder reflow profile, such as used for implementing selective rework for chip stacks in accordance with the preferred embodiment. FIG. 7 shows a typical solder reflow profile for tin-lead solder, running thru a 5-zone furnace. Before reflow, the assembly is pre-heated to near the melting point, or ~180-190 C to insure uniform heat dispersal and reflow. The part is then heated to above the melting point for a fixed duration, again to insure complete reflow, and then cooled.

The rework operation in this invention is essentially equivalent to the reflow operation in FIG. 7. At the optimum time, the devices at the selected interface of the chip stack are separated. The key to this invention is that only the desired interface is peaked to the reflow temperature, which means that only one interface in the chip stack is separated, not the whole stack. Pre-heating the chip stack 112 to the predetermined temperature just below the melting point, and then employing the rework tool 110 of the invention to raise the local temperature of the specific layer above the reflow temperature enables the chip stack separated only at the desired layer, leaving the remaining chips and µ-C4s connections intact.

Figure 8:
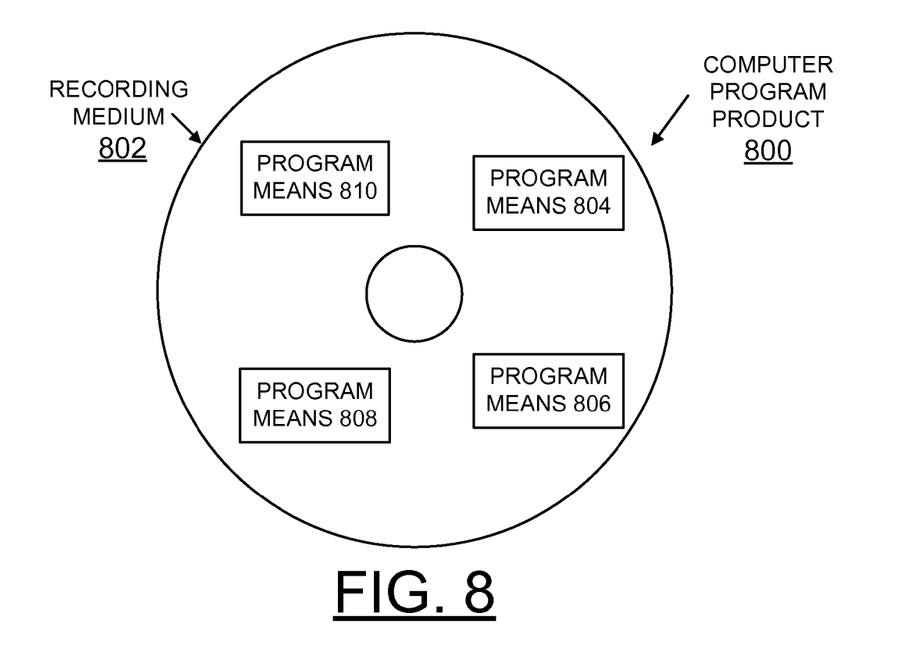
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, or another similar computer program product. Recording medium 802 stores program means 804, 806, 808, 810 on the medium 802 for carrying out the methods for implementing selective rework for chip stacks of the preferred embodiment in the system 100 of FIG. 1.

A sequence of program instructions or a logical assembly of one or more interrelated modules defined by the recorded program means 804, 806, 808, 810, direct the system 100 for implementing selective rework for chip stacks of the preferred embodiment.

While the present invention has been described with reference to the details of the embodiments of the invention shown in the drawing, these details are not intended to limit the scope of the invention as claimed in the appended claims.

What is claimed is:

1. An apparatus for implementing selective rework for chip stacks comprising:
   a chip stack including a plurality of chips;
   a chip in a chip stack;
   a backside metal layer on said chip; said backside metal layer for creating resistive heating;
   a rework tool in physical engagement with said backside metal layer;
   a rework tool controller coupled to said rework tool for applying a predefined current to the backside metal layer to reflow solder connections on said chip backside and for separating selected chips in said chip stack.

2. The apparatus for implementing selective rework for chip stacks as recited in claim 1 includes control code stored on a computer readable medium, wherein said rework tool controller uses said control code for implementing selective rework for chip stacks.

3. The apparatus for implementing selective rework for chip stacks as recited in claim 1 wherein said backside metal layer includes a pair of landing pads proximate to opposed edges of said chip for engagement with said rework tool, and a plurality of spaced apart traces, said traces connected to said landing pads.

4. The apparatus for implementing selective rework for chip stacks as recited in claim 1 wherein said rework tool includes a surface portion for physical engagement with said landing pad, and said rework tool has a predefined shape to facilitate separating selected chips in said chip stack.

* * * * *